United States Patent [19]

De Rossi

[11] Patent Number: 4,573,263
[45] Date of Patent: Mar. 4, 1986

[54] AUTOMATIC CONTACT-PIN SETTING APPARATUS FOR TESTING AN "OFF-GRID" PRINTED CIRCUIT

[76] Inventor: Ivo De Rossi, Via Carducci, 3, Arbizzano Di Negrar (Province of Verona), Italy

[21] Appl. No.: 657,426

[22] Filed: Oct. 3, 1984

[30] Foreign Application Priority Data

Oct. 7, 1983 [IT] Italy .................................. 84964 A/83

[51] Int. Cl.$^4$ ............................................. B23P 19/00
[52] U.S. Cl. ........................................ 29/741; 29/739
[58] Field of Search ................ 29/741, 739, 740, 837, 29/834

[56] References Cited

U.S. PATENT DOCUMENTS 4,327,483  5/1982  Zemek et al. ........................ 29/741

FOREIGN PATENT DOCUMENTS 2448960  10/1974  Fed. Rep. of Germany ........ 29/837

Primary Examiner—Howard N. Goldberg
Assistant Examiner—Leonard S. Selman
Attorney, Agent, or Firm—Guido Modiano; Albert Josif

[57] ABSTRACT

This machine essentially comprises: a contact-pin feeding head which drives contact-pins through holes in the adaptor having a pair of frames made fast with each other, but mutually movable, each of which carry one of two parallel superimposed perforated plates. The relative mobility of the two frames, and accordingly of the two adaptor plates, enables alignment, as the case may be during the step of inserting each contact-pin, of two homologous holes along the vertical line through the contact-pin feeding head. The various steps are controlled by a processor which has the configurations of the holes formed in the two plates, respectively, stored therein.

5 Claims, 2 Drawing Figures

AUTOMATIC CONTACT-PIN SETTING APPARATUS FOR TESTING AN "OFF-GRID" PRINTED CIRCUIT

BACKGROUND OF THE INVENTION

The present invention relates to an automatic contact-pin setting apparatus for testing off-grid printed circuits.

As is known, the so-called "in-grid" printed circuits, i.e. printed circuits supported on a plate formed with a plurality of test through holes arranged at a standard pitch, are test checked using a suitable control unit including a bed of needle-like metal plugs (feelers) and a processor to which the feelers are connected. The metal plugs are set in a plate of plastics material formed with a large number of perforations or holes which are arranged in a regular grid (normally with a hole pitch of 2.54 mm) and in which the feelers are accommodated.

In the instance of the printed circuit being provided with irregularly arranged checking locations, instead of the cited grid (i.e., the circuit is an "off-grid" printed circuit), it becomes necessary, in order to carry out the test check, to use a suitable adaptor (i.e., an adaptor for "off-grid" printed circuits) which can provide a pattern of the feelers on the check bed exactly matching the pattern of the check locations on the printed circuit to be tested. Such an adaptor was developed by the Applicant of this application and essentially comprises a top reference plate of plastics material formed with bores or holes arranged "off-grid" according to the printed circuit pattern to be tested, and a lower basic plate or plug bed arranged underneath the "off-grid" plate and having metal plugs accommodated in it according to a regular grid arrangement and in electric contact with a suitable scanning apparatus.

Metal contact-pins are manually inserted downwardly into the holes provided in the upper "off-grid" plate so that each of them extends to the nearest hole in the lower regular grid basic plate to contact the plug or feeler in it. The connecting pins also project upwardly into a respective hole in a printed circuit to be tested overlying the upper plate.

As mentioned above, it is current practice to have the contact-pins insertion carried out manually by an operator, which is time-consuming on account of the large number of pins involved. An additional disadvantage of such a conventional technique is that the operator, after inserting a contact-pin through a hole in the top plate, is unable to randomly insert the pin bottom portion through one of the lower plate holes (normally four in number) directly underlying the hole in question where plugs or feelers are located. The selection of one of the underlying holes made by the operator does not always lead, therefore, to the achievement of an optimum pin setting. More particularly, this situation results in technical difficulties both as regards physical positioning of each contact-pin owing to relatively large inclination of the contact-pin from the normal to the adaptor plane with attendant less-than-optimum connection to a corresponding feeler located underneath in the plug bed (lower plate), and its optimum functional positioning determined by the hole selected on the lower plate whose feelers are designed to establish electric connection for testing the printed circuit placed on the top plate. From the economical standpoint, manual insertion of the contact-pins, by requiring long operation times, cannot permit reuse of the contact-pins for different circuit patterns. In other words, large contact-pin stocks for various printed circuit types must be maintained, since it would be uneconomical to disassemble, and consequently destroy an already formed pattern, contact-pins previously placed on an adaptor intended for a specific circuit. Moreover, as an added disadvantage, manual application of the contact-pins disallows full repeatability of the positioning of the same, if required.

SUMMARY OF THE INVENTION

It is an object of this invention to overcome or substantially to reduce the cited drawbacks affecting the prior art, by providing an apparatus for setting in a fully automated manner contact-pins in two spaced plates of an adaptor for testing "off-grid" printed circuits, so as to arrange each contact-pin at an optimum position both relatively to the perpendicular to the adaptor plane and to the univocal location of its respective hole in the grid plate thereof, to significantly cut down the operation time and provide perfect repeatability of an adopted pattern, with attendant advantages of an economical and technical nature.

These and other objects are achieved by an automatic contact-pin setting apparatus according to the invention for testing "off-grid" printed circuits, the apparatus having a contact-pin feeding head, a scanning unit, and an adaptor including a bed of plugs which are accommodated in respective holes formed in a basic plate according to a standard grid configuration and electrically connected to the circuit scanning unit, a reference plate which has a plurality of through holes arranged in the same "off-grid" configuration as the "off-grid" printed circuit to be tested and is located facing the basic plate, characterized in that the said adaptor comprises a first frame bearing the said basic plate and a second frame supporting the said reference plate movably mounted one with respect to the other so as to shift the said basic and reference plates one with respect to the other and to the said contact-pin feeding head across parallel planes spaced from one another, drive means for actuating the said first and second frames, and a processing unit arranged to control the said contact-pin feeding head and the said drive means to sequentially move holes in the reference plate to an operative position with respect to the said contact-pin feeding head and to shift the plug hole nearest to it in the basic plate in alignment with it to receive a contact-pin from the said contact-pin feeding head.

BRIEF DESCRIPTION OF THE DRAWINGS

Further aspects and advantages of this invention will be more clearly understood from the following detailed description of a preferred illustrative embodiment thereof, with reference to the accompanying drawings, where.

DESCRIPTION OF THE PREFERRED EMBODIMENT

Figure 1:
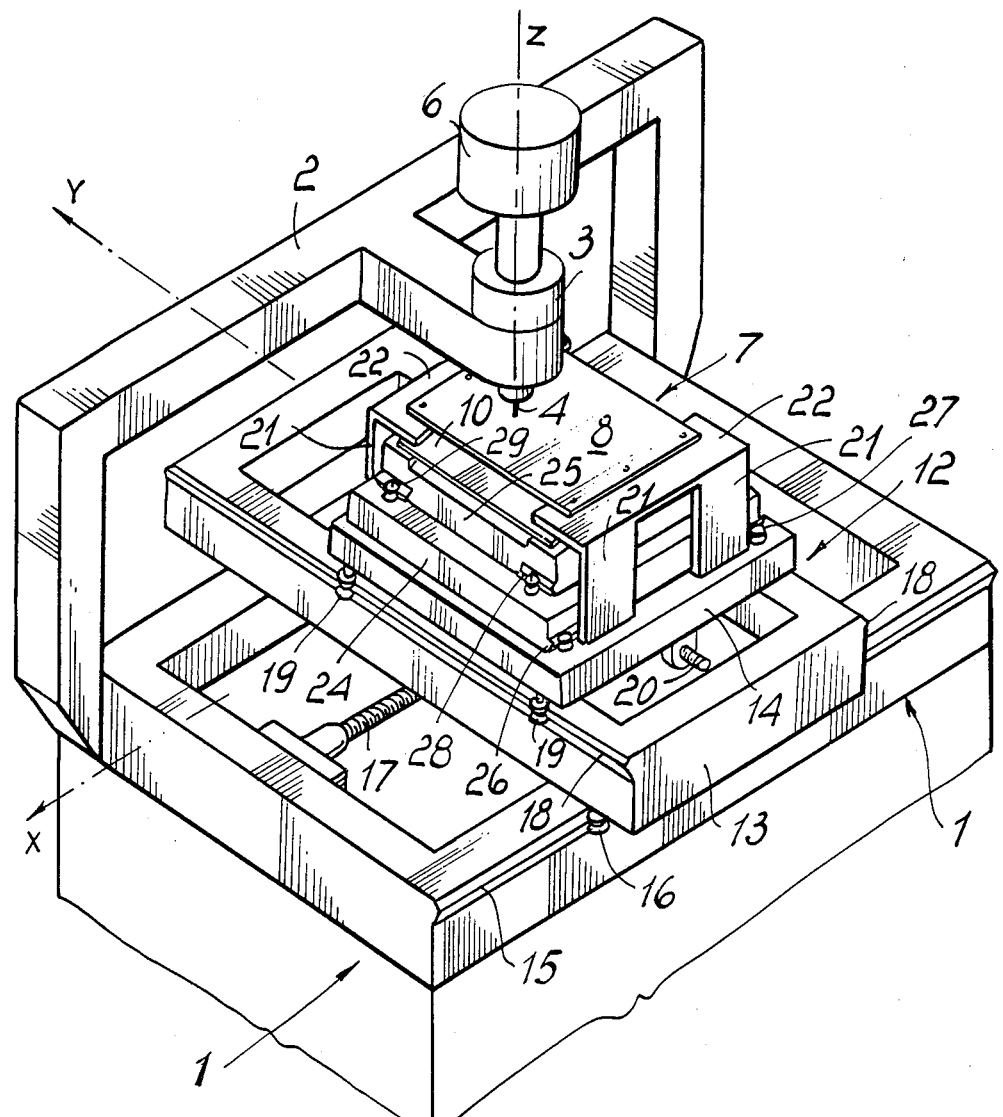
FIG. 1 is a general schematic isometric view of an automatic contact-pin setting machine.

With reference to the drawings, indicated at 1 is a stationary bed of the machine which carries a standing frame 2 bearing an operating head 3. The latter, which is of a design and construction known per se, is arranged to set of effect, through an essentially cylindrical vertical feeder 4, the insertion of individual contact-pins 5 (in the form of needle-like metal plugs). The contact-pins 5 are supplied to the feeder 4 from a container 6 acting as a magazine into an adaptor 7 for "off-grid" printed circuits. As shown in the drawings, the adaptor 7 comprises a first upper plate 8 of plastics material which has holes or perforations 9 therein, and a second lower plate 10 also consisting of plastics material. The holes 9 in the plate 8 are arranged "off-grid" according to a homologous pattern of that of the corresponding check points provided on a printed circuit to be tested (not shown) and placed on the plate 8. The second plate 10 extends parallel to the first plate 8 and is located below the latter at a distance therefrom which is slightly shorter than the length dimension of the contact-pins 5. The plate 10 is formed with a plurality of holes 11 arranged in a regular grid of standard hole pitch, e.g. equal to 2.54 mm.

The upper plate 8 is rigid with a first movable structure 12 movable with respect to the stationary bed 1 and arranged to perform horizontal movements, in synchronization with the operation of the operating head 3, along orthogonal back and forth directions X and Y. More particularly, the movable structure 12 comprises a first pair of decks fashioned as quadrangular frames 13 and 14 disposed parallel to, and stacked upon, one another. The lowermost frame 13 is slidably mounted on straight runways 15 fast with the stationary bed 1 by means of rollers 16, and is driven along the direction X by a first powered threaded bar 17. The uppermost frame 14 is slidably mounted on runways 18 integral with the frame 13, as by means of rollers 19, along the direction Y, and is driven by a second powered threaded bar 20. The frame 14 has at its periphery front and rear vertical uprights 21 delimiting an inner quadrangular space and bearing at the tops thereof a respective horizontal supporting element 22 carrying the upper plate 8 and extending from the uprights 21.

The lower plate 10 is made rigid with a second movable structure 23 arranged to perform horizontal movements, in synchronization with the operation of the operating head 3, along the orthogonal back and forth directions X and Y. Said second movable structure 23 comprises a pair of frames or decks 24 and 25 fashioned as quadrangular frames and extending parallel to each other within the space delimited by the uprights 21. The bottom frame 24 is slidable, along the direction X, relatively to the underlying frame 14 to which it is connected by means of a kinematic linkage between runways 26 and rollers 27. The top frame 25, having the lower plate 10 attached to its top, is slidable in the direction Y relatively to the frame 24 to which it is connected by means of runways 28 and rollers 29.

Figure 2:
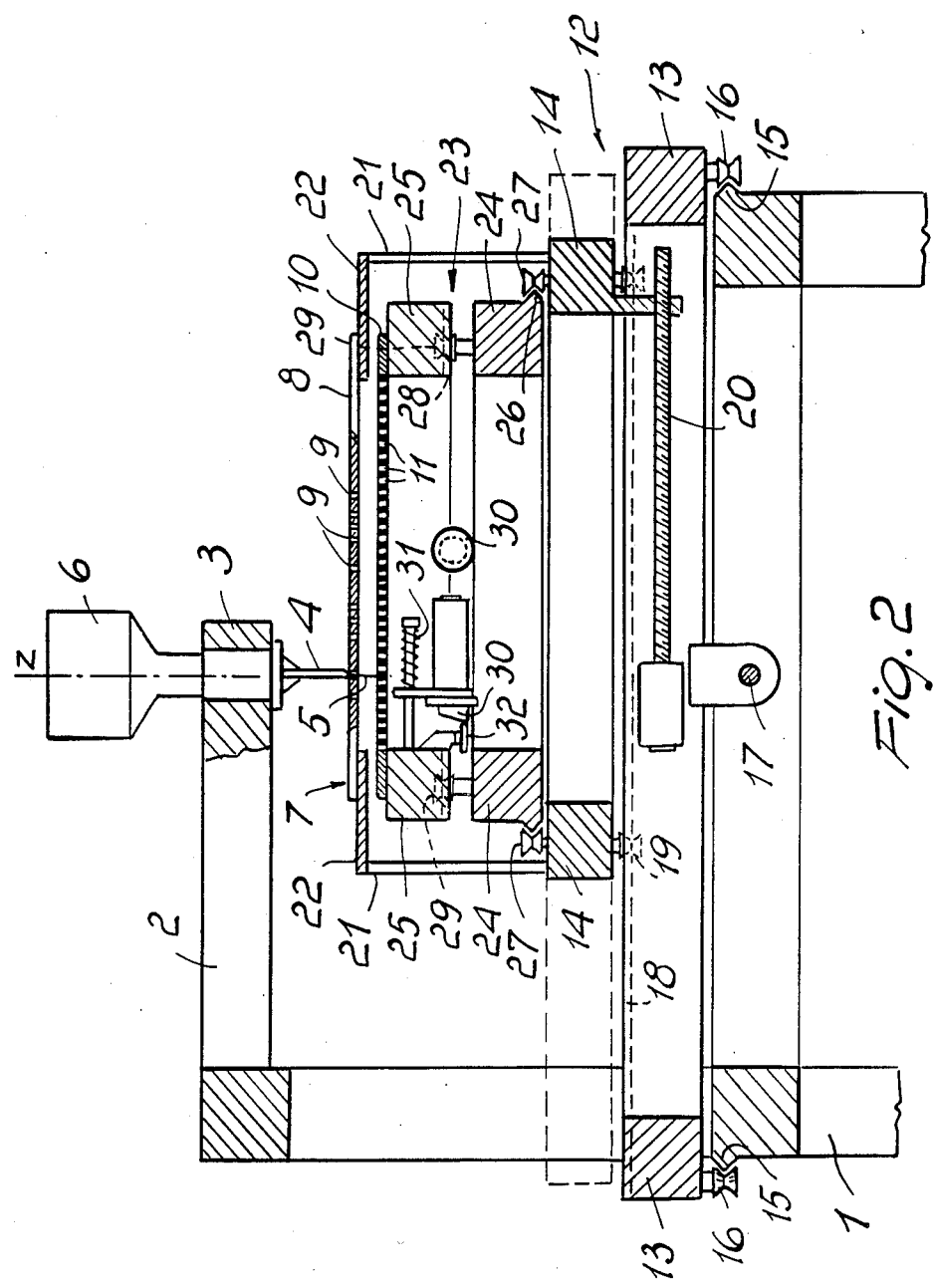
FIG. 2 shows a diagrammatic cross-sectional view of the machine taken along a vertical plane through a feeder of the machine.

It should be noted that, whereas the two frames 13 and 14 have travel ranges of the order of the overall dimension of the plate 8, the two decks 24 and 25 perform movements which are restricted to about ½ the pitch of the grid on the plate 10 (i.e., 1.27 mm). Such movements of the decks 24 and 25 are brought about by horizontal axis face cams 30 step driven against the bias of springs 31 (as schematically shown in FIG. 2 for the frame 25 only, a similar arrangement, shifted horizontally through 90°, being provided for the frame 24) and kinematically connected to rolling members 32 attached to the frames 24 and 25.

The drive members arranged to actuate the frames 13,14,24, and 25 are controlled by a processor (not shown) having the configurations of the holes formed in the plates 8 and 10, respectively, stored therein.

It is to be noted that information relating to the positions of the ("off-grid") holes in the plate 8 may be advantageously supplied to the processor by using directly the design specifications for the "off-grid" printed circuit (e.g., by using a perforated tape), thus avoiding self-learning by the testing machine of the hole pattern from an actually made printed circuit which might exhibit inaccuracies or manufacturing faults.

The operation of the above-described machine should be apparent from the foregoing.

During the initial step, the operator arranges for the securing and correct mutual positioning, using suitable reference means (not shown), of the two plates 8 and 10 respectively on the horizontal elements 22 and frame 25. In this condition, the holes 9 and 11 are offset to each other with respect to the vertical.

During the following step, by shifting the first movable structure 12, the upper plate 8 is positioned relatively to the head 3 such that the axis of one of the holes 9 in the plate 8 is brought into alignment with the vertical axis Z through the feeder 4. The positioning is completed on the basis of the directions provided by the processor (and transmitted to driving members for the threaded bars 17 and 20) wherein the geometric coordinates of each hole 9 have been previously stored.

At this point the processor, which also has the coordinates of the holes 11 stored therein, by assessing the height difference between homologous holes 9 and 11 (which has for its maximum value ½ the grid pitch, i.e. 1.27 mm), causes, through drive members for the cam 30, the second movable structure 23 to be shifted such as to bring the nearest hole 11 (among the four holes 11 directly underneath) into alignment with the overlying hole 9 already aligned with the axis Z of the feeder 4.

On completion of the alignment step, the head 3 will insert a contact-pin 5. Thereafter, the cycle is resumed for each intended hole 9 in the plate 8.

Of course, the invention may also be embodied differently from the embodiment illustrated in the foregoing; in particular, several changes of a practical and/or constructional nature may be made as may occur to a skilled person in the art, without departing from the invention scope as defined in the claims.

I claim:

1. An automatic contact-pin setting apparatus for testing an off-grid printed circuit, the apparatus having a contact-pin feeding head, a scanning unit, and an adaptor including a bed of plugs which are accommodated in respective holes formed in a basic plate according to a standard grid configuration and electrically connected to the circuit scanning unit, a reference plate which has a plurality of through holes arranged in the same "off-grid" configuration as the "off-grid" printed circuit to be tested and is located facing the basic plate, characterized in that the said adaptor comprises a first frame bearing the said basic plate and a second frame supporting the said reference plate movably mounted one with respect to the other so as to shift the said basic and reference plates one with respect to the other and to the said contact-pin feeding head across parallel planes spaced from one another, drive means for actuating the said first and second frames, and a processing unit arranged to control the said contact-pin feeding head and the said drive means to sequentially move holes in the reference plate to an operative position with respect to the said contact-pin feeding head and to shift the plug hole nearest to it in the basic plate in alignment with it to receive a contact-pin from the said contact-pin feeding head.

2. An apparatus according to claim 1, wherein said second frame comprises a pair of parallel stacked decks the bottom one whereof is slidable, along straigth runways fast with a stationary carrying structure, along a first direction and the top one whereof is slidable along straight runways fast with said bottom deck in a second direction extending orthogonally to said first direction, said top deck being provided peripherally with vertical uprights delimiting an inner space and carrying at the top thereof the said reference plate.

3. An apparatus according to claim 2, wherein the said first frame comprises a pair of stacked parallel decks located within said inner space, the bottom deck being slidably mounted relatively to the top deck in said first frame along said first direction and the top deck being slidably relatively to the bottom deck in said second frame along said second direction, said top deck in said frame supporting the said basic plate.

4. An apparatus according to claim 1, wherein the said drive means for said second frame comprises rotatively powered threaded bars, and said drive means for said first movable frame comprises kinematic linkages including step-driven face cams and rolling members attached to said second frame.

5. An apparatus according to claim 4, wherein said face cams kinematically linked to said rolling members are effective to allow for movements of said first frame relatively to said second frame equal to approximately $\frac{1}{2}$ the pitch of said regular grid on said reference plate.

* * * * *